United States Patent
Kramer et al.

(10) Patent No.: US 8,530,261 B2
(45) Date of Patent: Sep. 10, 2013

(54) METHOD FOR PRODUCING A COMPONENT, AND SENSOR ELEMENT

(75) Inventors: Torsten Kramer, Wannweil (DE); Kathrin Knese, Reutlingen (DE); Hubert Benzel, Pliezhausen (DE); Gregor Schuermann, Reutlingen (DE); Simon Armbruster, Gomaringen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 859 days.

(21) Appl. No.: 12/522,693

(22) PCT Filed: Nov. 28, 2007

(86) PCT No.: PCT/EP2007/062952
§ 371 (c)(1), (2), (4) Date: Mar. 5, 2010

(87) PCT Pub. No.: WO2008/089862
PCT Pub. Date: Jul. 31, 2008

(65) Prior Publication Data
US 2010/0164027 A1 Jul. 1, 2010

(30) Foreign Application Priority Data
Jan. 24, 2007 (DE) .......................... 10 2007 003 544

(51) Int. Cl.
*H01L 21/00* (2006.01)
(52) U.S. Cl.
USPC .......... 438/53; 438/51; 438/52; 257/E21.219; 257/E29.324
(58) Field of Classification Search
CPC .................................................. G01L 19/0038
USPC .............. 438/50, 51–53; 257/414, 416, 419, 257/417, E21.219, E29.324
See application file for complete search history.

(56) References Cited

U.S. PATENT DOCUMENTS

| | | | | |
|---|---|---|---|---|
| 5,632,854 A | * | 5/1997 | Mirza et al. | 438/53 |
| 5,725,785 A | * | 3/1998 | Ishida et al. | 216/2 |

(Continued)

FOREIGN PATENT DOCUMENTS

DE 10032579 1/2002

(Continued)

OTHER PUBLICATIONS

International Search Report, PCT International Patent Application No. PCT/EP2007/062952, dated May 27, 2008.

*Primary Examiner* — Kenneth Parker
*Assistant Examiner* — Jose R Diaz
(74) *Attorney, Agent, or Firm* — Kenyon & Kenyon LLP

(57) ABSTRACT

A method for producing a component having at least one diaphragm formed in the upper surface of the component, which diaphragm spans a cavity, and having at least one access opening to the cavity from the back side of the component, at least one first diaphragm layer and the cavity being produced in a monolithic semiconductor substrate from the upper surface of the component, and the access opening being produced in a temporally limited etching step from the back side of the substrate. The access opening is placed in a region in which the substrate material comes up to the first diaphragm layer. The etching process for producing the access opening includes at least one anisotropic etching step and at least one isotropic etching step, in the anisotropic etching step, an etching channel from the back side of the substrate being produced, which terminates beneath the first diaphragm layer in the vicinity of the cavity, and at least the end region of this etching channel being expanded in the isotropic etching step until the etching channel is connected to the cavity.

9 Claims, 2 Drawing Sheets

(56) References Cited

U.S. PATENT DOCUMENTS

| | | | |
|---|---|---|---|
| 6,787,052 B1 | 9/2004 | Vaganov | |
| 7,479,232 B2 | 1/2009 | Benzel et al. | |
| 2006/0014392 A1* | 1/2006 | Benzel et al. | 438/700 |
| 2006/0260408 A1 | 11/2006 | Villa et al. | |

FOREIGN PATENT DOCUMENTS

| | | |
|---|---|---|
| DE | 102004036032 | 7/2005 |
| DE | 102004036035 | 7/2005 |
| DE | 102004015444 | 9/2005 |
| EP | 1712515 | 10/2006 |

* cited by examiner

METHOD FOR PRODUCING A COMPONENT, AND SENSOR ELEMENT

FIELD OF THE INVENTION

The present invention relates to a method for producing a component having at least one diaphragm formed in the upper surface of the component, which diaphragm spans a cavity, and having at least one access opening to the cavity from the back side of the component, at least one first diaphragm layer and the cavity being produced from the upper surface of the component in a monolithic semiconductor substrate, and the access opening being produced in a temporally limited etching step from the back side of the substrate. Furthermore, the present invention relates to such a component, which is used as a sensor element for relative pressure measurement.

BACKGROUND INFORMATION

Conventionally, micromechanical sensor elements having diaphragms are used for relative pressure measurement. For this use, the diaphragm, which is usually formed in the upper surface of the component, must be accessible on both sides. In practice, the diaphragm of such micromechanical sensor elements is therefore frequently exposed from the back side of the wafer. Bulk micromechanical methods are used for this, such as KOH etching, relatively large openings developing, which codetermine the size of the sensor elements.

German Patent Application Nos. DE 100 32 579 A1, DE 10 2004 036 035 A1, and DE 10 2004 036 032 A1 describe methods that are also known as APSM (advanced porous silicon membrane) technology. These methods may be used to produce sensor elements for absolute pressure measurement having a very small chip surface and very exact production tolerances, for example. These methods may be implemented in a relatively simple manner and are accordingly cost-effective. Since the APSM technology is also CMOS compatible, circuit elements of an evaluation circuit and in particular resistors for the piezoresistive signal detection are able to be simply integrated into the sensor element.

In the method described in German Patent Application No. DE 100 32 579 A1, an etching medium that attacks the unmasked upper surface regions of a monolithic silicon substrate is used to produce a first porous layer region in the substrate, which layer borders the upper surface of the substrate. The rate of expansion of the pores may be influenced by the application of an electric field between the top side and the bottom side of the substrate and by suitable adjustment of the electric field strength during the etching attack. An increase in the electric field strength produces beneath the first layer region a second porous layer region, whose porosity is greater than the porosity of the first layer region. In a subsequent annealing step, the pores rearrange themselves in the second layer region such that a single large pore, i.e., a cavity, forms beneath the first layer region. At least the pores on the top side of the first layer region are largely closed by the annealing. Thus, it is possible to deposit a substantially monocrystalline silicon layer as a diaphragm layer on this first layer region, into which electric circuit elements, such as resistors, for example, may be integrated simply for signal detection and evaluation.

In the methods described in German Patent Application Nos. DE 10 2004 036 035 A1 and DE 10 2004 036 032 A1, a first region having a first doping is produced in a semiconductor substrate, which region is to form the cavity under the diaphragm to be produced. Above this first region, a latticed region having a second doping is produced, which acts as a stabilization element for the diaphragm to be produced. In a first method variant, the first region is then rendered highly porous by etching through the lattice openings of the stabilization element. As a result of the different dopings, the stabilization element is practically not attacked in the process. Afterward, the semiconductor substrate is provided with an epitaxy layer. This grows generally on the lattice structure of the stabilization element, the growth occurring both in the vertical and in the lateral direction, so that the lattice openings close. During the growth process or during an annealing step, the highly porous semiconductor material of the first region deposits to form a large pore or a cavity beneath the ideally monocrystalline epitaxy layer, which then acts as a diaphragm layer. In a second method variant, the semiconductor material of the first region is completely dissolved out even before the production of the epitaxy layer.

Since in this case, subject to the process, the diaphragm layers bordering the cavity often are made up of the same material as the substrate, to wit of monocrystalline silicon, a subsequent patterning of the back side of the substrate to produce an access opening to the cavity proves problematic. In this case, particular measures for protecting the diaphragm structure are necessary.

U.S. Patent Application No. 2006/0260408 A1 concerns itself with this problem. Among other things, it proposes to restrict temporally the etching attack from the back side of the substrate, namely such that an access opening to the cavity is produced, but the above-lying diaphragm structure is not attacked to the greatest extent possible.

In practice, it has been shown that such a temporal restriction of the etching attack on the back side is critical and therefore is not readily suitable for mass production. One reason for this is that the thickness of the diaphragm structure and the dimensions of the cavity are slight compared to the thickness of the substrate. In addition, the thickness of the diaphragm structure falls within the range of the thickness variations with which the wafers normally used as a substrate material are produced. On the whole, the temporal restriction of the etching attack on the back side is therefore very delicate.

SUMMARY

The present invention provides simple measures that allow for a subsequent back-side processing of components having a diaphragm structure in the upper surface of the component, in order to produce access openings to the cavity beneath the diaphragm.

According to an example embodiment of the present invention, the access opening is disposed in a region in which the substrate material comes up to the first diaphragm layer. The etching process for producing the access opening includes at least one anisotropic etching step and at least one isotropic etching step. In the anisotropic etching step, an etching channel from the back side of the substrate is produced, which terminates beneath the first diaphragm layer in the vicinity of the cavity. At least the end region of this etching channel is then expanded in the isotropic etching step until the etching channel is connected to the cavity.

The etching stop is realized during the production of the back access opening without additional etching stop layers, but rather simply through the temporal restriction of the etching process. To wit, according to the example embodiment of the present invention, it has been recognized that the duration of the etching process does not have to be adjusted exactly to the thickness of the substrate in the region under the cavity, but rather that in combination with a two-step etching process, skillful placement of the access opening results in a production tolerance that significantly simplifies the production process. According to the present invention, the access opening is placed in a region in which the substrate material comes up to the first diaphragm layer. Thus, the etching channel, which is produced in a first anisotropic etching step, does not lead directly into the cavity, but rather ends beneath the first diaphragm layer in the vicinity of the cavity. That is, the duration of this anisotropic etching step only has to be timed such that the end of the etching channel lies in a region that approximately corresponds to the vertical dimension of the cavity. A connection between the etching channel and the cavity is not produced until the subsequent isotropic etching step. Indeed, the duration of this etching step must be adapted to the position and depth of the etching channel, but it is not as critical as in the case of the anisotropic etching attack. The measures according to the present invention make the production process more robust on the whole. Thus, the duration of the etching process may be timed independently of thickness variations of the substrate, for example, as long as these thickness variations are in the usual scope.

There are various possibilities for implementing the method according to the example embodiment of the present invention, with regard to the placement of the access openings. Thus, an access opening may be disposed in the outer edge region of the cavity, for example, in order to influence the mechanical properties of the diaphragm as little as possible. In one advantageous refinement of the present invention, the cavity is formed by a hollow space, with which a stub line for the back pressure connection, which stub line runs under the first diaphragm layer, is connected. In this instance, the diaphragm region above the hollow space is used for measuring-value acquisition. The access opening is then disposed in the region of the stub line, in order to impair as little as possible the mechanical properties of the diaphragm in the region above the hollow space. In an additional advantageous variant of the present invention, the access opening is produced in the region of a point of support of the diaphragm, which is formed inside the cavity. The point of support supports and stabilizes the diaphragm during the production process.

The example method according to the present invention assumes that the diaphragm structure is produced in the substrate material, from the upper surface of the component. This may take place in different manners. It may be particularly advantageous to use the above-described APSM technology to produce the diaphragm structure.

Accordingly, in one method variant, initially a first porous layer region is produced in a substrate. Then, beneath the first porous layer region, a second porous layer region is produced in the substrate, the porosity of the second layer region being greater than the porosity of the first layer region. In a subsequent annealing step, the second layer region is converted into a hollow space or a cavity. In this annealing step, the pores of the first layer region close at least to a great extent, so that this first layer region forms a first diaphragm layer above the cavity.

In a further variant of the method according to the present invention, a porous layer region is produced in the substrate, above which an epitaxy layer of the substrate material is then deposited. In a subsequent annealing step, the porous layer region is converted into a cavity, so that the epitaxy layer forms a first diaphragm layer above the cavity.

In one particularly advantageous method variant, a first layer region having a first doping is produced in a semiconductor substrate. Above this first layer region, a preferably lattice-shaped stabilization region having at least one opening is produced, the doping of the stabilization region differing from that of the first layer region. The first layer region is then etched in a porous manner before an epitaxy layer is produced above the stabilization region. A temperature treatment ultimately converts the porous first layer region into a cavity, so that the epitaxy layer forms a first diaphragm layer above the cavity. This method variant may be modified to the effect that the semiconductor material of the first layer region is not only etched in a porous manner, but rather is already dissolved before the epitaxy layer is produced, so that a cavity forms under the stabilization region.

The measures according to the example embodiment of the present invention—to wit, the special placement of the back access opening in connection with a two-step, temporally limited etching process for producing this access opening—allow for the production of sensor elements for relative pressure measurement in APSM technology and all of the advantages that the use of this technology involves. Thus, in APSM technology, sensor elements having any diaphragm geometry may be implemented for very small chip sizes and very exact production tolerances. In addition, the production process is CMOS compatible, i.e., there is the possibility of the monolithic integration of circuit elements of an evaluation circuit on the sensor element. The use of APSM technology as part of the method according to the present invention is also advantageous in view of the production costs of the sensor elements, since a cost-effective base material, to wit, a silicon substrate, may be used, which may be processed simply with the aid of usual, easily manipulable and controllable semiconductor methods.

It is particularly advantageous when a trenching method is used to pattern the back side of the component in the first etching step. In this manner, access openings having a relatively small cross-sectional area may be produced in a targeted manner even in the event of great substrate thicknesses, which is advantageous with regard to the increasing miniaturization of micromechanical components.

BRIEF DESCRIPTION OF THE DRAWINGS

As previously explained, there are various options for developing and refining the teaching of the present invention in an advantageous manner. For this purpose, reference is made to the description of an exemplary embodiment of the present invention below in light of the figures.

DETAILED DESCRIPTION OF EXAMPLE EMBODIMENTS

Sensor element 10 shown in FIGS. 1 through 4 is a piezoresistive relative pressure sensor having an integrated evaluation circuit whose micromechanical structure includes a diaphragm 11 that is formed in the upper surface of the component and spans a cavity 12 in a substrate 1. For example, it may be a silicon wafer.

Figure 1:
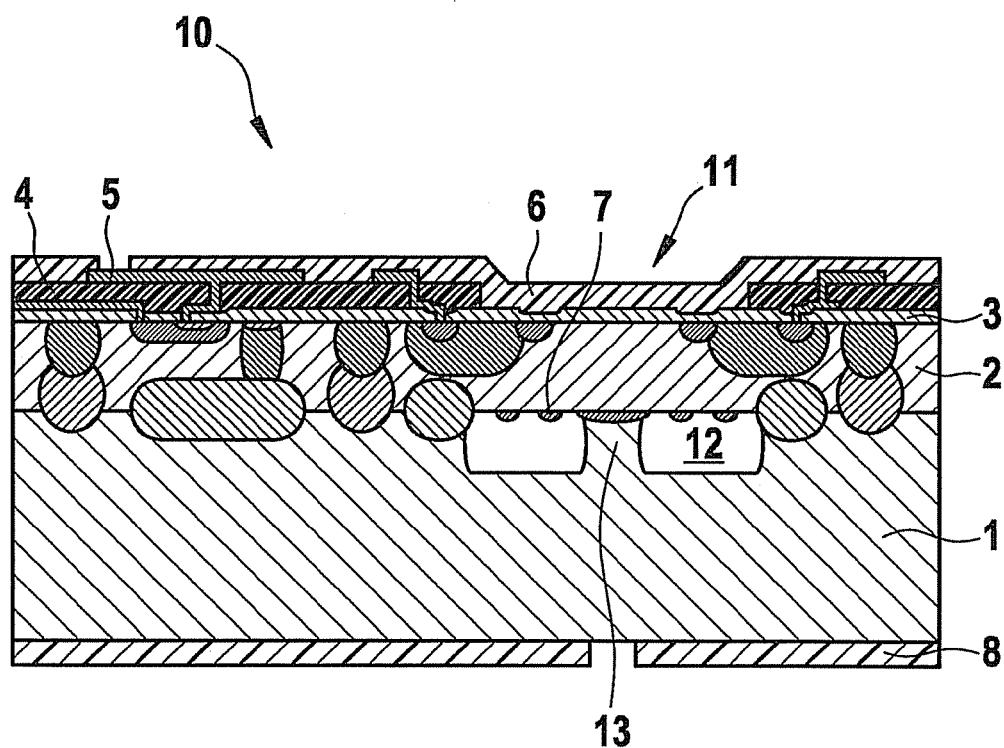
FIGS. 1 to 4 show a schematic cross-section through a sensor element in different stages of the production method.

FIG. 1 shows sensor element 10 after cavity 12 was produced in an APSM process from the upper surface of the component. In the exemplary embodiment shown here, a point of support 13 inside the diaphragm regions was also produced, at which diaphragm 11 is still connected to the bulk material of substrate 1. The mask for the APSM process was accordingly designed for this purpose. Due to a suitable layout and suitable doping of an n-lattice 7 in the region of cavity 12, the region of point of support 13 was not etched in a porous manner during the anodization of the APSM process.

In this APSM process, a first diaphragm layer of substrate material formed above cavity 12, which layer was strengthened by an n-epitaxy layer 2 on silicon substrate 1.

After this micromechanical processing of substrate 1, the circuit elements were integrated, which are implemented in the form of doped regions in n-epitaxy layer 2 and substrate 1, but are not labeled individually in the figures. Then a contact layer 3 was deposited on n-epitaxy layer 2. Furthermore, the evaluation circuit includes metallic circuit traces or conductor layers 5, which are insulated from each other by an intermediate dielectric 4. Ultimately, the entire component surface was also provided with a passivation 6.

In a next step, a masking layer 8 was deposited on the back side of substrate 1 for a trenching process from the substrate back side. The patterning of masking layer 8 then defined the position, the form, and the size, more exactly the cross-sectional area, of etching channel 15 to be generated such that etching channel 15 forms taking into account all lateral tolerances within point of support 13. For example, a suitable photoresist layer or also a so-called "hard mask," e.g., of Si-oxide, may be used as masking layer 8.

Figure 2:
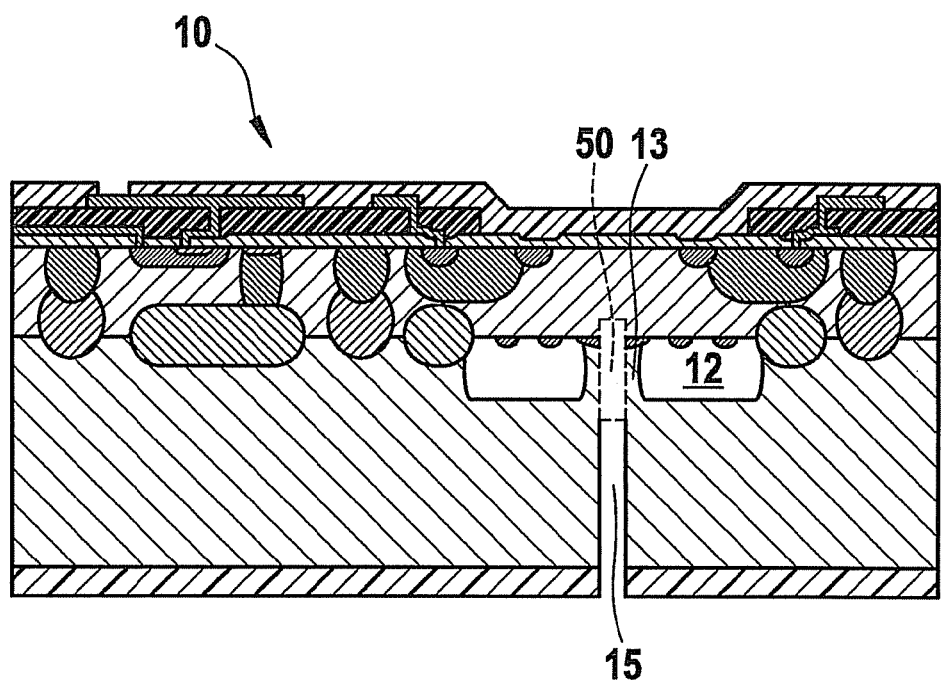

FIG. 2 shows sensor element 10 after the trenching process, in which an etching channel 15 from the component back side was formed, which extends within point of support 13 into the region of cavity 12. The depth of etching channel 15 was determined by the duration of the trenching process. The region of etching channel 15 that is labeled 50 in FIG. 2 illustrates the vertical tolerance region for the trench depth. The lower limit of the trench depth lies roughly on the level of the cavity floor, the upper limit lies roughly on the level of the cavity ceiling. Due to this tolerance region 50, an etching stop layer is not necessary. By disposing etching channel 15 in the region of point of support 13, the trench tolerances both in width and in depth may be absorbed.

Figure 3:
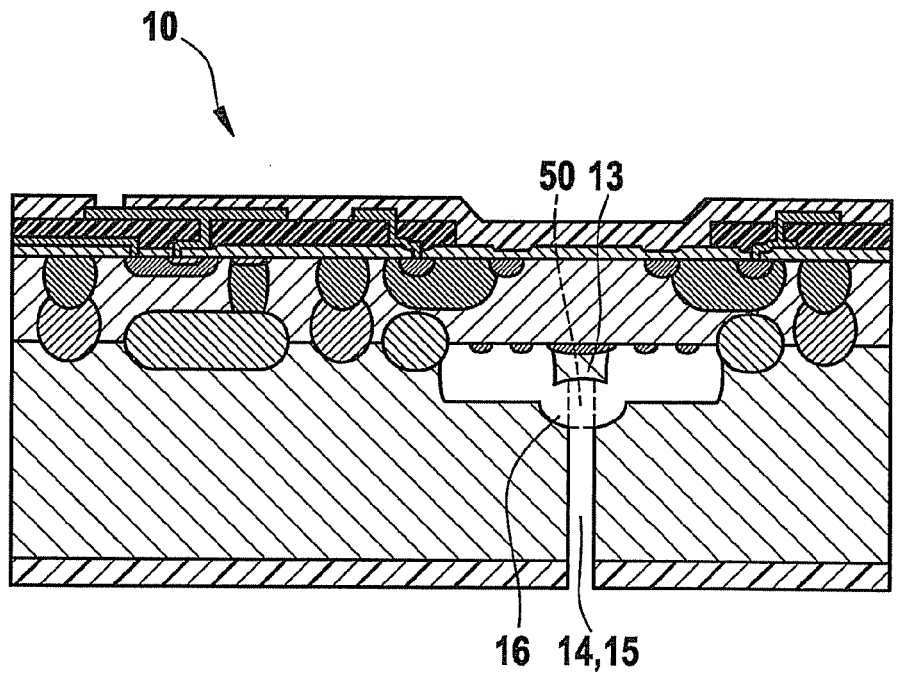
Figure 4:
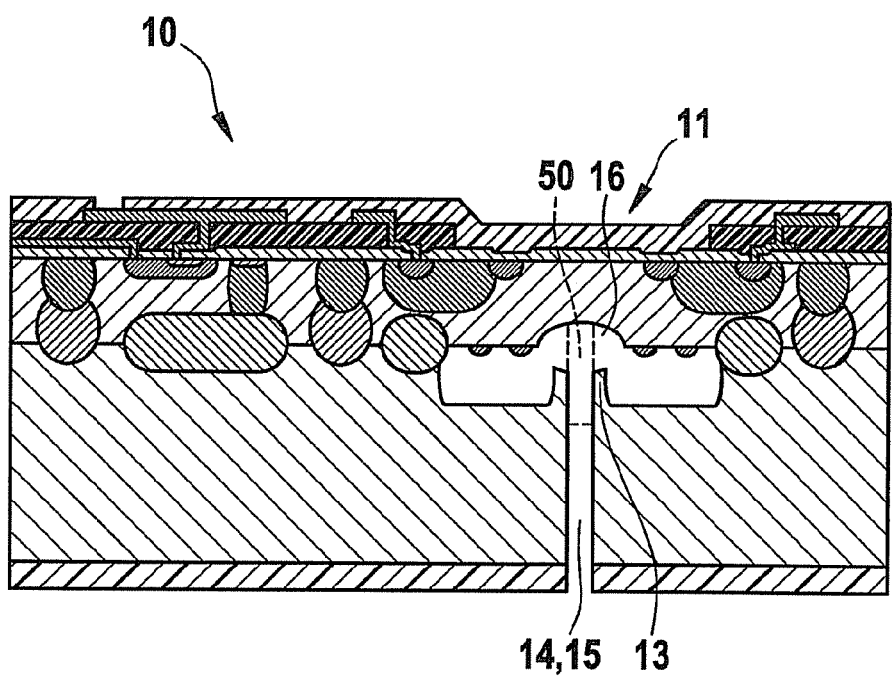

During the trenching process, which forms the first anisotropic etching step of the method according to the present invention, a switch is constantly made between an isotropic etching attack and a sidewall passivation. In the process, the passivation layer on the floor is etched through, but it remains intact on the wall, so that etching channel 15 may be implemented with a very high aspect ratio. Following the trenching process, an isotropic etching step that also starts from the component back side is performed. For this purpose, the last isotropic etching attack of the trenching process may simply be extended, for example. Alternatives to this include an isotropic etching step using C1F3 or a wet-etching step, for example. In the isotropic etching step, end region 16 of etching channel 15 expands like a bubble. This etching attack is continued until etching channel 15 forms an access opening 14 to cavity 12 with its end region 16, which is shown in FIGS. 3 and 4. FIG. 3 shows an etching channel 15, whose end region 16 lies on the level of the cavity floor, that is, at the lower limit of tolerance region 50, and FIG. 4 shows an etching channel 15 whose end region 16 lies on the level of the cavity ceiling, that is, at the upper limit of tolerance region 50. Through the lateral expansion of end region 16 of etching channel 15, point of support 13 was opened toward the cavity. In this manner, diaphragm 11 became freely displaceable. Since access opening 14 forms a back pressure connection to diaphragm 11, sensor element 10 may be used for relative pressure measurement. Apart from this, sensor element 10 may also be used as a back-side pressure sensor for use in aggressive media. In this case, a corresponding reference vacuum must be enclosed on the substrate front side by a suitable packaging technology.

In conclusion, reference is made to the fact that within the framework of the method according to the present invention, access opening 14 does not necessarily have to be disposed centrally in the region of a point of support 13 of diaphragm 11, but rather may also be disposed on the side, in the region of a stub line connected to the cavity, for example.

What is claimed is:

1. A method for producing a component having at least one diaphragm formed in an upper surface of the component, which diaphragm spans a cavity, and having at least one access opening from a back side of the component to the cavity, the method comprising:
   producing at least one first diaphragm layer and the cavity from the upper surface of the component in a monolithic semiconductor substrate; and
   producing the access opening from the back side of the component in a temporally restricted etching process without an etching stop layer;
   wherein the access opening is placed in a region in which the substrate material comes up to the first diaphragm layer, and the etching process for producing the access opening includes at least one anisotropic etching step and at least one isotropic etching step, in the anisotropic etching step, an etching channel from the back side of the substrate being produced, which terminates beneath the first diaphragm layer in a vicinity of the cavity, and at least an end region of the etching channel being expanded in the isotropic etching step until the etching channel is connected to the cavity.

2. The method as recited in claim 1, wherein the access opening is disposed in an outer edge region of the cavity.

3. The method as recited in claim 1, wherein the cavity is formed by a hollow space, with which a stub line running under the first diaphragm layer is connected, and the access opening is produced in the region of the stub line.

4. The method as recited in claim 1, wherein the access opening is disposed in a region of a point of support of the diaphragm within the cavity.

5. The method as recited in claim 1, wherein a first porous layer region is produced in the semiconductor substrate, a second porous layer region is produced under the first porous layer region, a porosity of the second layer region being greater than a porosity of the first layer region, and the second layer region is converted into a cavity in an annealing step, while the pores of the first layer region are closed at least to a great extent, so that the first layer region forms a first diaphragm layer above the cavity.

6. The method as recited in claim 1, wherein a porous layer region is produced in the semiconductor substrate, an epitaxy layer of the substrate material is deposited above the porous layer region, and the porous layer region is converted into a cavity in an annealing step, so that the epitaxy layer forms a first diaphragm layer above the cavity.

7. A method for producing a component having at least one diaphragm formed in an upper surface of the component, which diaphragm spans a cavity, and having at least one access opening from a back side of the component to the cavity, the method comprising:
   producing at least one first diaphragm layer and the cavity from the upper surface of the component in a monolithic semiconductor substrate; and
   producing the access opening from the back side of the component in a temporally restricted etching process;
   wherein the access opening is placed in a region in which the substrate material comes up to the first diaphragm layer, and the etching process for producing the access opening includes at least one anisotropic etching step and at least one isotropic etching step, in the anisotropic etching step, an etching channel from the back side of the substrate being produced, which terminates beneath the first diaphragm layer in a vicinity of the cavity, and at least an end region of the etching channel being expanded in the isotropic etching step until the etching channel is connected to the cavity;

wherein a first layer region having a first doping is produced in the semiconductor substrate, and above the first layer region a lattice-shaped stabilization region having at least one opening is produced, a doping of the stabilization region differing from a doping of the first layer region; the first layer region is etched in a porous manner, an epitaxy layer is produced above the stabilization region, and the porous first layer region is converted by a temperature treatment into a cavity, so that the epitaxy layer forms a first diaphragm layer above the cavity.

8. A method for producing a component having at least one diaphragm formed in an upper surface of the component, which diaphragm spans a cavity, and having at least one access opening from a back side of the component to the cavity, the method comprising:

producing at least one first diaphragm layer and the cavity from the upper surface of the component in a monolithic semiconductor substrate; and producing the access opening from the back side of the component in a temporally restricted etching process;

wherein the access opening is placed in a region in which the substrate material comes up to the first diaphragm layer, and the etching process for producing the access opening includes at least one anisotropic etching step and at least one isotropic etching step, in the anisotropic etching step, an etching channel from the back side of the substrate being produced, which terminates beneath the first diaphragm layer in a vicinity of the cavity, and at least an end region of the etching channel being expanded in the isotropic etching step until the etching channel is connected to the cavity;

wherein a first layer region having a first doping is produced in the semiconductor substrate, and above the first layer region a lattice-shaped stabilization region having at least one opening is produced, a doping of the stabilization region differing from a doping of the first layer region, and a semiconductor material of the first layer region is dissolved out, so that a cavity forms under the stabilization region, and above the stabilization region an epitaxy layer is produced, which forms a first diaphragm layer above the cavity.

9. The method as recited in claim 1, wherein the etching channel is produced by trenching.

* * * * *

UNITED STATES PATENT AND TRADEMARK OFFICE
CERTIFICATE OF CORRECTION

PATENT NO.       : 8,530,261 B2                                                Page 1 of 1
APPLICATION NO. : 12/522693
DATED            : September 10, 2013
INVENTOR(S)      : Kramer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1083 days.

Signed and Sealed this

Fifteenth Day of September, 2015

Michelle K. Lee
*Director of the United States Patent and Trademark Office*